United States Patent [19]

Ury

[11] Patent Number: 4,802,178
[45] Date of Patent: Jan. 31, 1989

[54] HIGH SPEED FIBEROPTIC LASER MODULE

[75] Inventor: Israel Ury, Los Angeles, Calif.

[73] Assignee: Ortel Corporation, Alhambra, Calif.

[21] Appl. No.: 849,960

[22] Filed: Apr. 10, 1986

[51] Int. Cl.⁴ ............................................. H01S 3/096
[52] U.S. Cl. ........................................ 372/36; 333/33; 350/96.20; 372/38; 357/81
[58] Field of Search ....................... 372/36, 38; 333/33; 350/96.20; 357/81, 17

[56] References Cited

U.S. PATENT DOCUMENTS

| | | | |
|---|---|---|---|
| 3,761,846 | 9/1973 | Tsuboi | 333/33 |
| 4,237,474 | 12/1980 | Ladany | 357/81 |
| 4,307,934 | 12/1981 | Palmer | 350/96.20 |
| 4,399,541 | 8/1983 | Kovats et al. | 372/36 |
| 4,413,881 | 11/1983 | Kovats | 350/96.20 |
| 4,479,698 | 10/1984 | Landis et al. | 350/96.20 |
| 4,500,165 | 2/1985 | Scholl et al. | 350/96.20 |
| 4,591,711 | 5/1986 | Taumberger | 250/227 |
| 4,722,586 | 2/1988 | Dodson et al. | 350/96.20 |

FOREIGN PATENT DOCUMENTS 2002140 2/1979 United Kingdom .
2124402 2/1984 United Kingdom .
2126795 3/1984 United Kingdom .

Primary Examiner—James W. Davie
Attorney, Agent, or Firm—Christie, Parker & Hale

[57] ABSTRACT

A small module contains means for converting an electrical signal to a correspondingly modulated light signal on an optical fiber. Frequency of the signal can range from D.C up to many gigahertz. A semiconductor laser diode is mounted on a high thermal conductivity substrate on a thermoelectric cooler for controlling laser temperature. The optical fiber output is soldered to the laser substrate with an end in alignment with the laser junction. A laser bias circuit is on a connection substrate adjacent to the laser substrate. A connection substrate also includes a deposited signal lead line connected to the bias circuit by an impedance matching means. Electrical signals from the pin of an external coaxial connector are coupled to the lead line. The laser bias circuit and signal lead line are electrically connected to the laser diode by wires between the connection substrate and the laser substrate. A photodiode in the module in the light path from the laser provides a control signal.

25 Claims, 2 Drawing Sheets

HIGH SPEED FIBEROPTIC LASER MODULE

FIELD OF THE INVENTION

This invention concerns a tiny module for receiving a microwave frequency signal which modulates a laser for transmitting a high frequency optical signal.

BACKGROUND

Considerable interest has been generated in recent years in transmitting communication signals in the form of light conveyed by fiberoptics. Many conventional signal modulation techniques are electric and means must be provided for converting such electrical signals to a modulated light beam. Semiconductor laser diodes are quite useful for this purpose since they can be modulated at extremely high rates, however, as the switching speed of signals increases to take advantage of the laser speed, greater difficulties are encountered in coupling the electrical signals to the optical devices.

There is, therefore, a need for a high speed laser control device which will apply modulated signals to a semiconductor laser diode for producing optical signals. Such a device should be rugged and self contained for practical utilization. It should accept signals at frequencies into the microwave range and couple them efficiently without interference to the laser diode. Preferably the device should exhibit a characteristic impedance of fifty ohms to match the impedance of a variety of conventional signal sources. It is desirable that the device be hermetically sealed for enhanced reliability in various environmental conditions. Such a device should be readily controllable, preferably with self-contained diagnostic sensors. It is preferably small and has low power consumption so that heat generation problems are minimized. It is also desirable that such a device be economically manufactured.

BRIEF SUMMARY OF THE INVENTION

There is, therefore, provided in practice of this invention, according to a presently preferred embodiment a semiconductor laser module in a sealed metal housing. A semiconductor laser diode is mounted on a laser substrate with an optical fiber connected to the substrate in alignment with the laser for receiving an output signal. A separate microwave signal connection substrate is also contained in the housing. A microwave lead on this latter substrate is coupled to a pin of an external connector for application of a microwave signal from an external source. A laser bias circuit is placed on the signal substrate and is connected to the microwave lead by an impedance matching connection. One terminal of the laser diode is connected to the bias circuit and the other terminal is connected to ground.

Preferably the laser substrate is mounted on a thermoelectric cooler for temperature control. A thermistor on the substrate senses its temperature. It is also desirable to mount a photodiode in the module for sensing light from the laser for control of its performance.

BRIEF DESCRIPTION OF THE DRAWINGS

These and other features and advantages will be appreciated as this invention becomes better understood by reference to the following detailed description when considered in connection with the accompanying drawings wherein:

FIG. 3 is a circuit diagram of the electrical drive for the laser diode in the module.

DESCRIPTION

Figure 1:
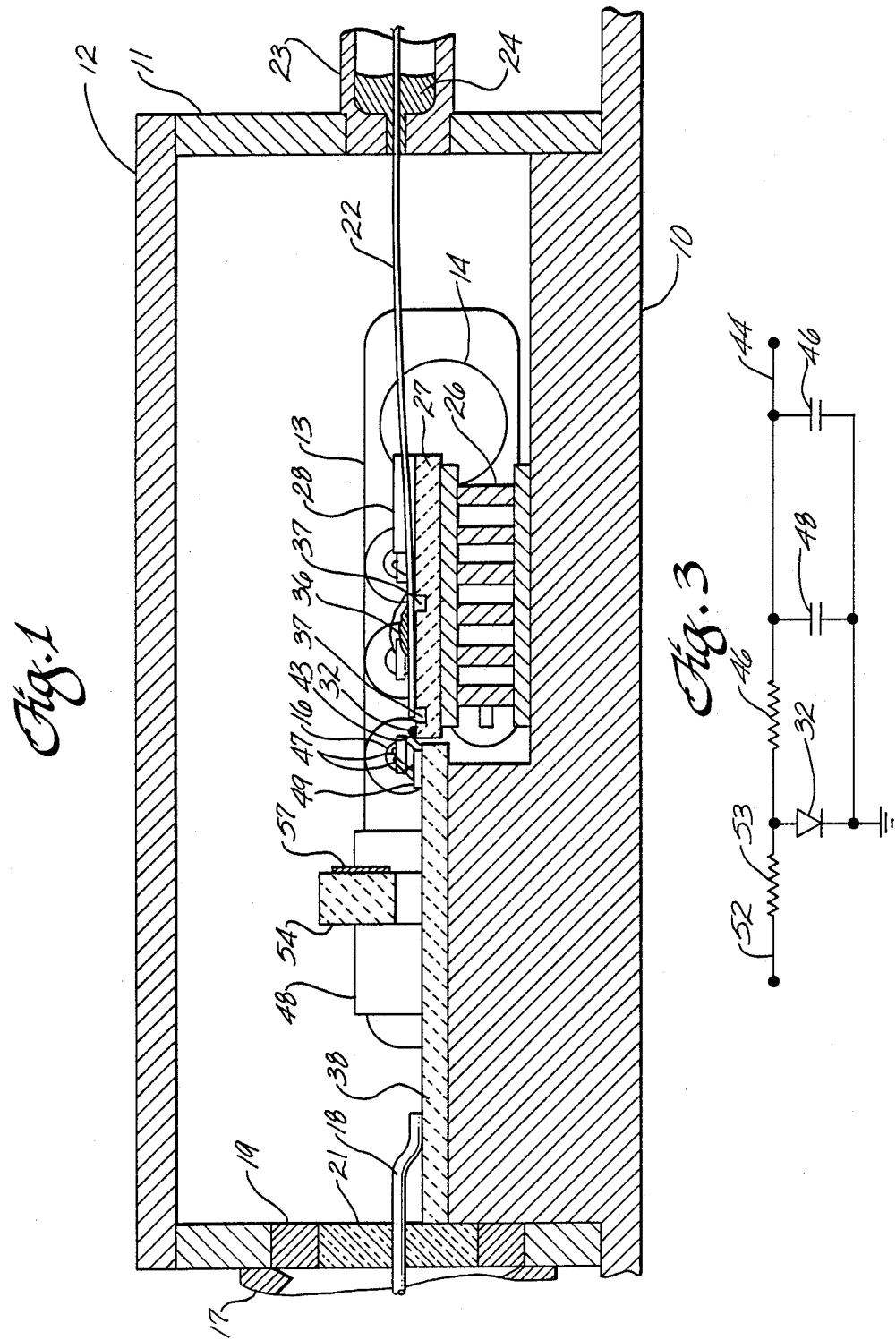
FIG. 1 is a transverse cross section of a laser communication module constructed according to principles of this invention.

The laser module is hermetically sealed in a grounded metal housing formed of a base 10, a rectangular ring or frame 11 forming the walls of the housing, and a cover 12. In an exemplary embodiment the base is stamped or machined from molybdenum for high thermal conductivity. The frame is sliced from a hollow extrusion of Kovar, an alloy having a favorable coefficient of thermal expansion for forming a glass to metal seal. The frame is preferably furnace brazed to the molybdenum base. After the interior components are assembled, the cover is welded on the top of the ring or frame to form a hermetic seal.

A conventional multi-pin electric connector 13 is brazed through one side of the frame 11. The connector includes male and female threaded alignment studs 14 for securing an external connector (not shown). The connector on the module has seven pins 16, the functions of which are labeled in FIG. 2.

Figure 2:
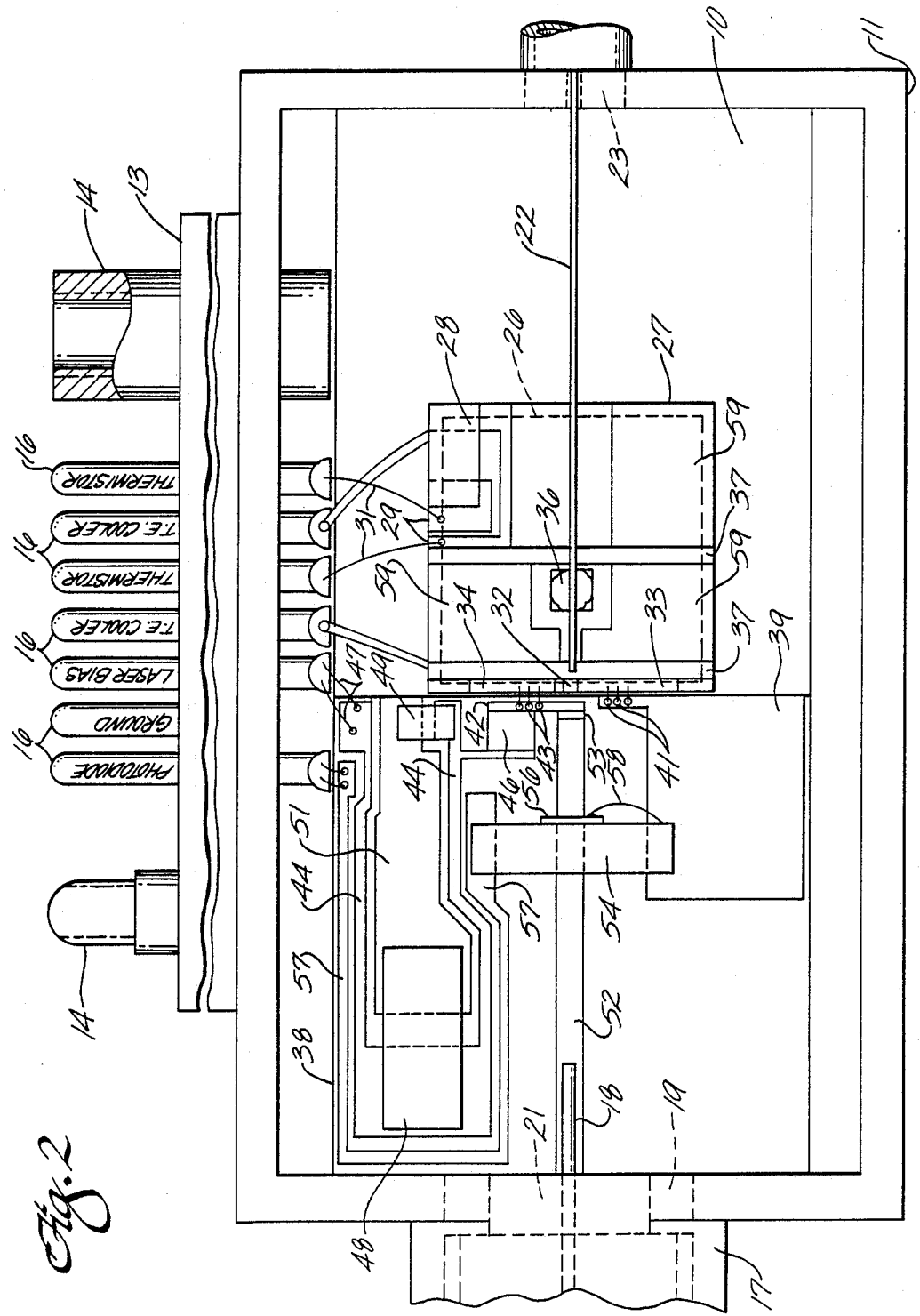
FIG. 2 is a plan view of the module with the cover removed to show the interior.

At one end of the frame 11 there is a conventional female threaded coaxial microwave connector 17, only a fragment of which is illustrated in FIG. 2. The center lead of the coaxial connector electrically connects to a Kovar pin 18 which is sealed into a Kovar ring or sleeve 19 by glass 21. The Kovar sleeve is brazed into the frame 11 of the module. Thus, a microwave signal can be conveyed into the module through a hermetic seal by way of the pin 18.

At the opposite end of the frame from the microwave connector, an optical fiber 22 is also brought through a hermetic seal. The optical fiber is a conventional single mode fiber having a diameter of about 125 microns. Great care is needed to align a single mode fiber and a high speed laser diode and this invention is particularly well suited for such an application. It will be apparent that similar principles are also usable with multi-mode optical fibers. The perimeter of at least the end portion of the fiber is metallized so as to be wettable by solder. The optical fiber passes through a Kovar tube 23 brazed into the end of the frame. The fiber is soldered into the tube to provide a tight seal where the optical fiber enters the module.

A thermoelectric cooler 26 is soldered onto the module base 10. By passing an electric current through the thermoelectric cooler, the junction secured to the base can be heated while the opposite junction remote from the base is cooled. In use the module base may be connected to an external heat sink for maintaining a substantially constant temperature.

A rectangular ceramic laser substrate 27 is soldered to the cold junction of the thermoelectric cooler. A high thermal conductivity ceramic, such as beryllium oxide, is preferred for the laser substrate.

A conventional thermistor 28 is bonded to the laser substrate. The thermistor with its high change in resistivity as a function of temperature is used for controlling the temperature of the substrate by varying current through the thermoelectric cooler. Metallized leads 29 are deposited on the laser substrate to provide electrical connection to the thermistor. Wires 31 connect these leads to the thermistor connector pins 16. The metallized leads, as are others hereinafter described, are deposited on the substrate by sputtering and electroplating in a conventional manner. Screening, vacuum metallizing or electroless plating may be used as desired.

A high speed semiconductor laser 32 is bonded onto the laser substrate near one edge. To obtain high speed, the laser is extremely small, measuring only 250 microns square and about 75 microns thick. The lasing junction of the diode is in a plane parallel to the plane of the substrate. One electrical terminal of the laser diode is connected to a metallized pad 33 on the laser substrate. The other terminal of the laser diode is wire bonded to a second metallized pad 34 on the laser substrate.

The optical fiber 22 is soldered to a small metallized area on the laser substrate by a bead of indium-tin solder 36 which wets the metallized coating on the fiber. First the laser diode is secured to the laser substrate, and electrically connected. In a typical embodiment the lasing junction of the diode produces a one to three micron wide line and the light transmitting core of the fiber is nine microns in diameter. The fiber is manipulated into alignment with the laser to give the maximum light output and then the solder is melted to permanently affix the fiber in alignment with the laser.

By having the laser diode and the end of the optical fiber rigidly secured to the same substrate, temperature changes that might otherwise cause differential thermal expansion and misalign the components are not of any difficulty. Further, the end of the fiber can be maintained in alignment with the junction of the diode despite accelerations that might otherwise flex the fiber.

A pair of trenches 37 have been diamond sawed across the laser substrate. These trenches isolate the area where the optical fiber is secured to the substrate from the laser diode and its leads, and also isolate the thermistor and its leads. The trenches provide some thermal isolation during soldering, and also serve as a barrier to solder flux which might damage the laser diode, for example.

A ceramic signal connection substrate 38 is soldered to the module base with one edge adjacent to an edge of the laser substrate near the laser diode. A metallized grounding pad 39 is deposited on one face of the connection substrate. The edge of the connection substrate next to the laser substrate is also metallized to provide an electrical path from the grounding pad around the edge to the metallized face soldered to the module base. The module is in turn grounded to the ground pin 16 on the electrical connector. One of the metallized pads 33 connected to the laser diode is connected to the grounding pad by a plurality of wires 41.

The other lead 34 connected to the laser diode is connected to a metallized strip 42 on the signal connection substrate by a plurality of wires 43. This strip is connected to a laser bias lead 44 deposited on the signal connection substrate. The electrical connection between the metallized strip and bias lead is by way of a deposited signal isolation resistor 46. The resistor is deposited at a slightly lower resistance than required and the edges are then laser trimmed to increase resistance to the desired level in a conventional manner. The bias lead 44 is connected to the laser bias pin 16 by wires 47. A pair of capacitors 48 and 49 are connected between the bias lead and a second ground pad 51 on the connection substrate. The capacitors serve as filters in the laser bias circuit to further isolate the signal from the bias circuit.

A microwave lead line 52 is deposited across the connection substrate. One end of the microwave lead line is connected by way of a deposited resistor 53 to the strip 42 which is in turn connected to the laser diode. This resistor serves to provide an impedance match between the external microwave circuit and the circuits in the module. The impedance matching resistor 53 is deposited simultaneously with the signal isolating resistor 46 with a different geometry to have about half the resistance of the signal isolation resistor. The pin 18 to the external microwave connector is bent to contact the opposite end of the microwave lead line, and is welded or soldered to it to provide the external electrical connection for a high frequency signal.

In the illustrated embodiment the microwave lead is a microstrip deposited on a substrate grounded on its opposite face. If desired one may use a conventional coplanar strip line having grounded areas deposited on each side of the signal conductor. Further, if desired, matching of impedance can be provided by selecting appropriate capacitance and inductance in the circuit rather than using an impedance matching resistor. This type of impedance matching is appropriate where the module is intended to operate in a selected frequency range, whereas resistive impedance matching is more appropriate where the module may operate all the way from D.C. to gigahertz frequencies.

The connection substrate with the laser bias circuit deposited thereon is separate from the laser substrate for electrical and thermal isolation. Thus, the laser diode is the only component on the laser substrate that generates any appreciable heating. This minimizes the capacity of the thermoelectric cooler needed for controlling temperature of the laser diode. Further, use of separate substrates permits separate manufacture and testing of components that employ different manufacturing processes.

FIG. 3 is the equivalent electrical circuit for the laser diode connection in the module. The circuit components are numbered similarly to the components in the physical layout illustrated in FIGS. 1 and 2. In an exemplary embodiment the laser diode 32 has a resistance of five ohms. The impedance matching resistor 53 which is connected to the microwave lead line 52 is trimmed to have a resistance of 45 ohms. The signal isolating resistor 46 which is connected to the DC laser bias voltage is trimmed to have a resistance of 100 ohms. Exemplary capacitances of the capacitors 46 and 48 are 0.01 microfarad and 33 picofarads, respectively. It is found that the laser module produces modulated light output in response to electrical signals ranging from direct current to digital or analog signals at gigahertz frequencies.

A ceramic bridge 54 is mounted on the connection substrate 38 straddling the microwave lead line 52. One end of the bridge is soldered to the ground pad 39 and the other end is soldered to a photodiode lead line 56 which is wire bond connected to the photodiode pin 16 on the connector. A photodiode 57 is mounted on the face of the bridge toward the laser diode. A portion of the face of the bridge is metallized to provide electrical connection between the photodiode lead 56 and one terminal of the photodiode. The other terminal of the photodiode is connected to another metallized area (not shown) on the face of the bridge by a wire 58 to provide electrical connection to the ground pad.

The photodiode receives light from the portion of the laser junction remote from the optical fiber. The resultant signal may be used for adjusting the laser diode bias current for obtaining a desired laser response.

Three additional metallized pads 59 are present on the laser substrate. These pads are not used during operation of the laser module, but are provided for temporary connections used during manufacture for testing the module. The ground pad 39 on the connection substrate is also larger than needed for merely connecting the laser diode and photodiode to ground. This large area can also be used for preliminary testing.

It should also be recognized that the laser module is quite small. In an exemplary embodiment the frame of the module, separate from its electrical connectors is less than three centimeters long and only 17 millimeters wide.

Although but one preferred embodiment of laser module for high speed modulation of an optical signal by an electrical input has been described and illustrated herein, many modifications and variations will be apparent to one skilled in the art. For example, the layout of the circuit elements on the connection substrate can clearly be arranged as desired. Other means in substitution for or in addition to the photodiode, thermistor and thermoelectric cooler can be provided for monitoring and control of the laser module. Arrangements can also be made to have the laser diode and the bias circuit on the same substrate, although the illustrated arrangement is preferred. It is therefore to be understood that within the scope of the appended claims the invention may be practiced otherwise than as specifically described.

What is claimed is:

1. A semiconductor laser module comprising:
   a housing;
   a laser substrate in the housing;
   a semiconductor laser diode mounted on the laser substrate;
   an optical fiber connected to the same laser substrate in alignment with the laser;
   a connection substrate mounted on the base of the housing beside the laser substrate;
   a metallized lead line on the connection substrate;
   means for bringing an external electrical signal through the housing and applying the signal to the lead line;
   means on the connection substrate for matching impedance of the lead line and the laser diode;
   means for connecting one terminal of the laser diode to the means for matching impedance; and
   means for connecting the other terminal of the laser diode to ground.

2. A laser module as recited in claim 1 comprising a thermoelectric cooler supporting only the laser substrate for temperature control thereof.

3. A laser module as recited in claim 2 comprising a thermistor mounted on the laser substrate for control of the thermoelectric cooler.

4. A laser module as recited in claim 1 comprising a laser bias circuit on the connection substrate and connected to the non-grounded terminal of the laser diode.

5. A laser module as recited in claim 4 wherein the means for connecting the bias circuit and resistor to a terminal of the laser diode comprises a metallized pad on the laser substrate connected to the laser diode;
   a metallized pad on the connection substrate connected to the bias circuit; and
   at least one wire bonded between such pads.

6. A laser module as recited in claim 5 wherein the means for connecting a terminal of the laser diode to ground comprises:
   a metallized pad on the laser substrate connected to a terminal of the laser diode;
   a metallized pad on the connection substrate connected to ground; and
   at least one wire bonded to both of the pads.

7. A laser module as recited in claim 6 wherein the grounded pad on the connection substrate is electrically connected to the module housing.

8. A laser module as recited in claim 1 wherein the means for bringing an electrical signal through the housing and applying the signal to the lead line comprises a coaxial connector external to the module, a pin extending through a wall of the module and means for connecting the pin to the lead line.

9. A laser module as recited in claim 8 wherein the pin is directly bonded to the lead line.

10. A laser module as recited in claim 1 wherein the optical fiber is soldered to the laser substrate.

11. A laser module as recited in claim 10 comprising a trench in the laser substrate between the laser diode and the solder connection of the optical fiber.

12. A laser module as recited in claim 1 wherein the housing is a grounded metal can.

13. A laser module as recited in claim 1 wherein the means for matching impedance comprises a resistor deposited on such a substrate and having sufficient resistance for matching a fifty ohm external circuit.

14. A laser module as recited in claim 1 comprising a photodiode in the housing adjacent to the junction of the laser for monitoring light emitted by the laser diode.

15. A laser module as recited in claim 14 wherein the photodiode is mounted on a bridge straddling the metallized lead line on the connection substrate.

16. A laser module as recited in claim 1 comprising laser bias circuit on such a substrate, the bias circuit comprising a signal isolating resistor deposited on such a substrate in series with the laser diode and a laser bias voltage connector pin external to the module; and capacitive coupling to ground between the bias voltage pin and the signal isolating resistor for further isolating the signal from the bias circuit.

17. A semiconductor laser module comprising:
   a grounded metal housing;
   an optical fiber hermetically sealed through a wall of the housing;
   a coaxial electric connector on the housing including a pin hermetically sealed through a wall of the housing;
   an electrical connector having a plurality of connector pins hermetically sealed through a wall of the housing;
   a ceramic laser substrate rigidly mounted in the housing;
   a semiconductor laser diode mounted on the laser substrate;
   means for rigidly securing the optical fiber to the laser substrate with an end in alignment with the laser junction of the laser diode;
   a separate ceramic connection substrate rigidly mounted in the housing;
   a metallized ground pad on the connection substrate and electrically connected to the housing;
   means for electrically interconnecting the ground pad and one terminal of the laser diode;

a laser bias circuit deposited on the connection substrate;

a signal lead line deposited on the connection substrate and connected to the laser bias circuit by an impedance matching resistor deposited on the connection substrate;

means for connecting the pin to the lead line; and means for connecting the laser bias circuit and impedance matching resistor to the other terminal of the laser diode.

18. A laser module as recited in claim 17 comprising a thermoelectric cooler supporting the laser substrate for temperature control thereof.

19. A laser module as recited in claim 18 comprising a thermistor mounted on the laser substrate for control of the thermoelectric cooler.

20. A laser module as recited in claim 17 comprising a photodiode in the housing adjacent to the junction of the laser for monitoring light emitted by the laser diode.

21. A laser module as recited in claim 20 wherein the photodiode is mounted on a bridge straddling the metallized lead line on the connection substrate.

22. A semiconductor laser module comprising:

a housing;

a laser substrate in the housing;

a semiconductor laser diode mounted on the laser substrate;

an optical fiber soldered to the laser substrate with an end in alignment with the junction of the laser;

a separate connection substrate in the housing;

a metallized lead line on the connection substrate;

means for applying an external electrical signal to the lead line;

means for matching impedance of the external electrical signal and the laser diode connected between one lead of the laser diode and the lead line;

a laser bias circuit deposited on the connection substrate and electrically connected to the lead line and the laser diode; and means for connecting the other terminal of the laser diode to ground.

23. A laser module as recited in claim 22 comprising a thermoelectric cooler supporting the laser substrate for temperature control thereof.

24. A laser module as recited in claim 23 comprising a thermistor mounted on the laser substrate for control of the thermoelectric cooler.

25. A laser module as recited in claim 22 wherein the means for applying an electrical signal to the lead line comprises a coaxial connector external to the module, a pin extending through a wall of the module and means for connecting the pin to the lead line.

* * * * *